United States Patent
Lee et al.

(10) Patent No.: US 7,091,522 B2
(45) Date of Patent: Aug. 15, 2006

(54) STRAINED SILICON CARBON ALLOY MOSFET STRUCTURE AND FABRICATION METHOD THEREOF

(75) Inventors: Min-Hung Lee, Taipei (TW); Shu Tong Chang, Hsinchu (TW); Shing Chii Lu, Hsinchu (TW); Chee-Wee Liu, Taipei (TW)

(73) Assignee: Industrial Research Technology Institute, Hsinchu (TW)

( * ) Notice: Subject to any disclaimer, the term of this patent is extended or adjusted under 35 U.S.C. 154(b) by 0 days.

(21) Appl. No.: 10/791,816

(22) Filed: Mar. 4, 2004

(65) Prior Publication Data
US 2005/0023520 A1    Feb. 3, 2005

(30) Foreign Application Priority Data
Jul. 29, 2003    (TW) .............................. 92120723 A

(51) Int. Cl.
*H01L 29/15*    (2006.01)

(52) U.S. Cl. .................. 257/77; 257/190; 257/191
(58) Field of Classification Search ........... 257/18–19, 257/77, 190–191
See application file for complete search history.

(56) References Cited

U.S. PATENT DOCUMENTS

| 6,358,806 | B1* | 3/2002 | Puchner ..................... 438/308 |
| 2002/0100942 | A1* | 8/2002 | Fitzgerald et al. .......... 257/369 |
| 2002/0125471 | A1* | 9/2002 | Fitzgerald et al. ............ 257/19 |
| 2003/0057416 | A1* | 3/2003 | Currie et al. ................. 257/19 |
| 2005/0054150 | A1* | 3/2005 | Mirabedini et al. ......... 438/199 |

* cited by examiner

*Primary Examiner*—Sara Crane
(74) *Attorney, Agent, or Firm*—Birch, Stewart, Kolasch and Birch, LLP

(57) ABSTRACT

A MOSFET structure utilizing strained silicon carbon alloy and fabrication method thereof. The MOSFET structure includes a substrate, a graded SiGe layer, a relaxed buffer layer, a strained silicon carbon alloy channel layer, a gate dielectric layer, a polysilicon gate electrode (or metal gate electrode) and a source/drain region.

6 Claims, 7 Drawing Sheets

STRAINED SILICON CARBON ALLOY MOSFET STRUCTURE AND FABRICATION METHOD THEREOF

The instant application claims priority to Taiwanese Application No. 92120723, filed on Jul. 29, 2003 the entire contents of which are hereby incorporated by reference.

BACKGROUND OF THE INVENTION

1. Field of the Invention

The present invention relates in general to a structure of MOSFET. In particular, the present invention relates to a strained silicon carbon alloy MOSFET structure and fabrication method thereof.

2. Description of the Related Art

In the present technology for fabricating metal-oxide-semiconductor field-effect transistor (MOSFET), strained silicon is formed on the relaxed SiGe layer to generate tensile strain. It had been confirmed that hole and electron mobility thereof are improved. Intel Corporation has implemented strained silicon technology into 90 nm process technology. The present technology, however, has the drawback of asymmetrical speed increasing between PMOS and NMOS even under the same Ge content. Theoretically, when using carbon doping to increase strain of the strained silicon channel, a highly increased current driving force and device speed of PMOS, and therefore improved symmetry of the CMOS, is anticipated, in addition, since carbon has a higher phonon energy than that of silicon, when adding carbon into a strained Si channel, the carrier saturation speed in the strained silicon carbon alloy channel exceeds that in the strained silicon channel as phonon energy increases. Furthermore, the added carbon can reduce outdiffusion of boron and phosphorous, so that the source/drain junction and channel has an abrupt doping distribution, preventing short-channel effect and minimizing device dimensions.

SUMMARY OF THE INVENTION

Accordingly, the main object of the present invention is to provide a transistor structure combining the merits of strained silicon formed on the relaxed buffer layer and a strained silicon carbon alloy with higher strain quantity to form a strained silicon carbon alloy CMOS thereof, minimizing device dimensions and improving device current driving force.

Another object of the present invention is to provide a MOSFET fabrication method using a strained silicon carbon alloy layer formed on relaxed buffer layer.

In order to achieve the above objects, the invention provides a MOSFET structure, comprising a substrate, a graded SiGe layer for gradually increasing Ge concentration, a relaxed buffer layer for growing the strained silicon carbon alloy, a strained silicon carbon alloy channel for improving carrier mobility, enhancing current and accelerating speed, a gate dielectric layer, a gate polysilicon electrode (or metal gate electrode), and a source/drain region to form a MOSFET.

According to the invention, a strained silicon carbon alloy MOSFET fabrication method comprising forming a graded SiGe layer on the substrate, then forming a relaxed buffer layer on the graded SiGe layer for relaxing SiGe, and forming a silicon carbon alloy layer on the relaxed buffer layer, where the epitaxial silicon carbon alloy layer is a strained silicon carbon alloy layer with tensile strain acting as a virtual substrate. Using lithography and etching, a gate dielectric layer, a gate polysilicon electrode (or metal gate electrode), and, a source/drain are formed to create a MOSFET.

According to the invention, the carrier of the strained silicon carbon alloy of the transistor channel can be electron or hole, the strain on the strained silicon carbon alloy can accelerate the carrier speed, and, the gate polysilicon layer is an n+ poly gate or p+ poly gate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and accompanying drawings, which are given by way of illustration only, and thus are not limitative of the present invention, and wherein.

DETAILED DESCRIPTION OF THE INVENTION

In this specification, "overlying the substrate", "above the layer", or "on the film" denote a relative positional relationship with respect to the surface of the base layer, regardless of the existence of intermediate layers. Accordingly, these expressions may indicate not only the direct contact of layers, but also, a non-contact state between one or more laminated layers. In addition, Silicon carbon alloy refers silicon carbon alloy, not silicon carbide.

Figure 1:
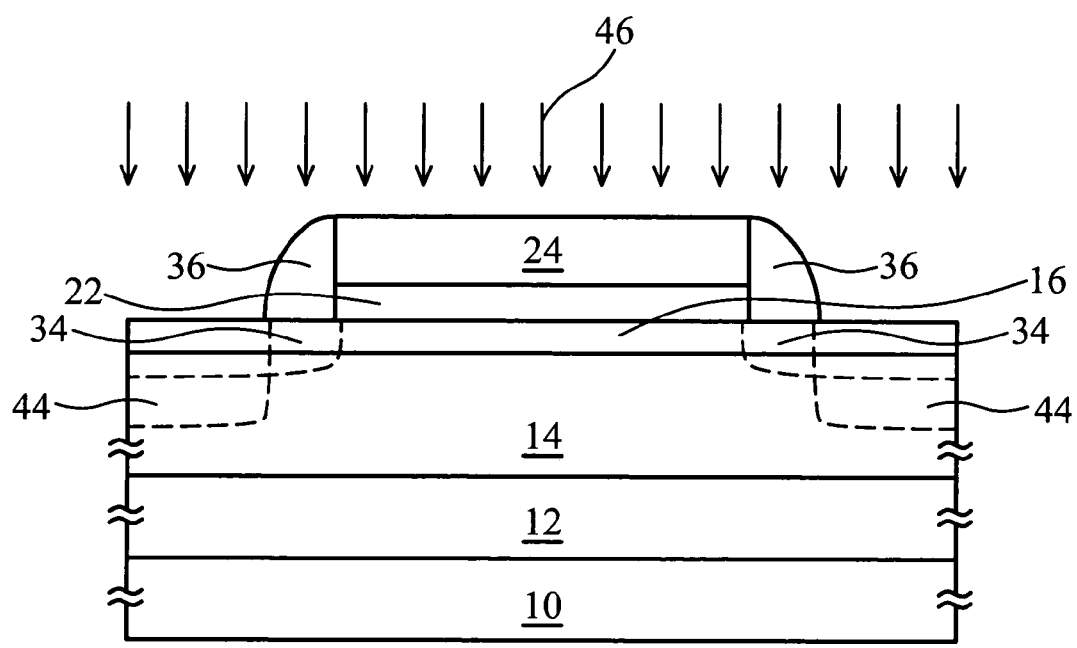
FIG. 1 is a cross section of a strained silicon carbon alloy MOSFET structure according to the present invention.
Figure 2A:
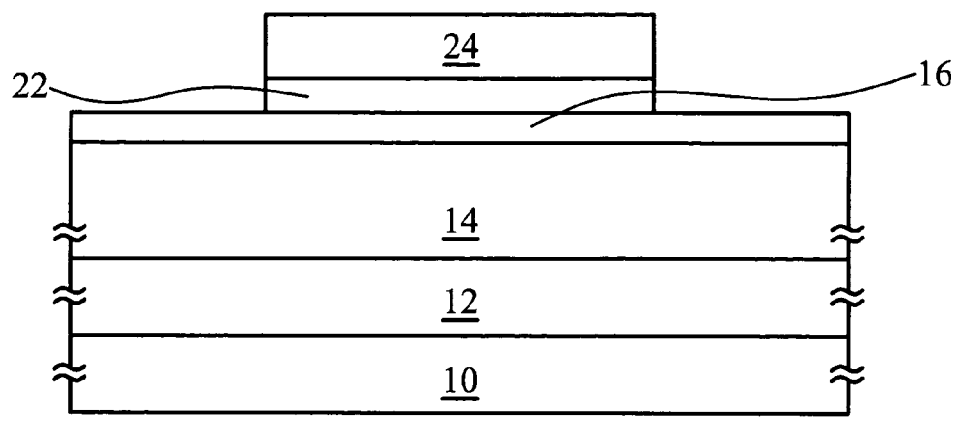
FIGS. 2a~2d are cross sections of fabrication processes of a strained silicon carbon alloy MOSFET structure according to the present invention.
Figure 2B:
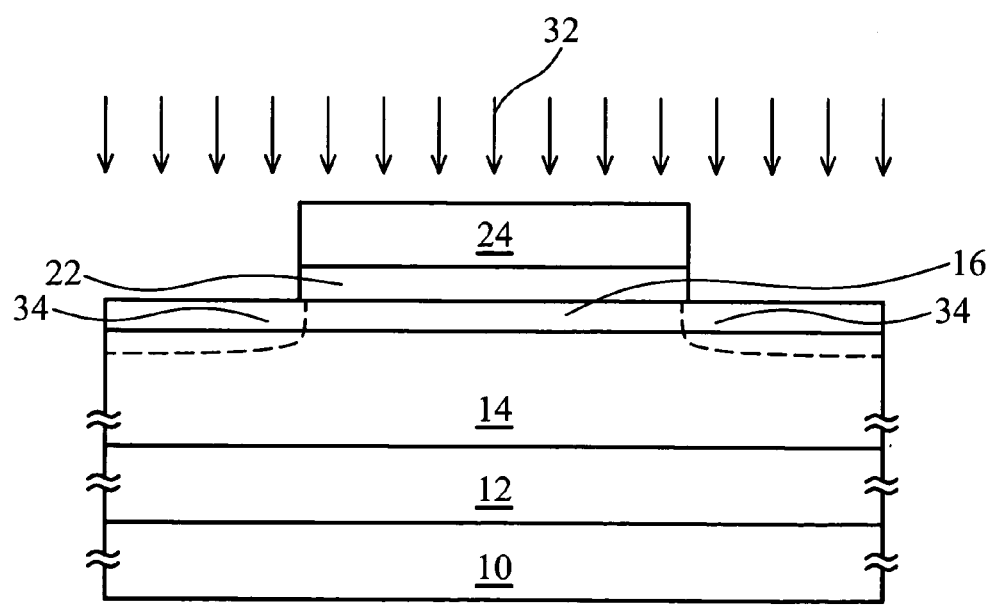
Figure 2C:
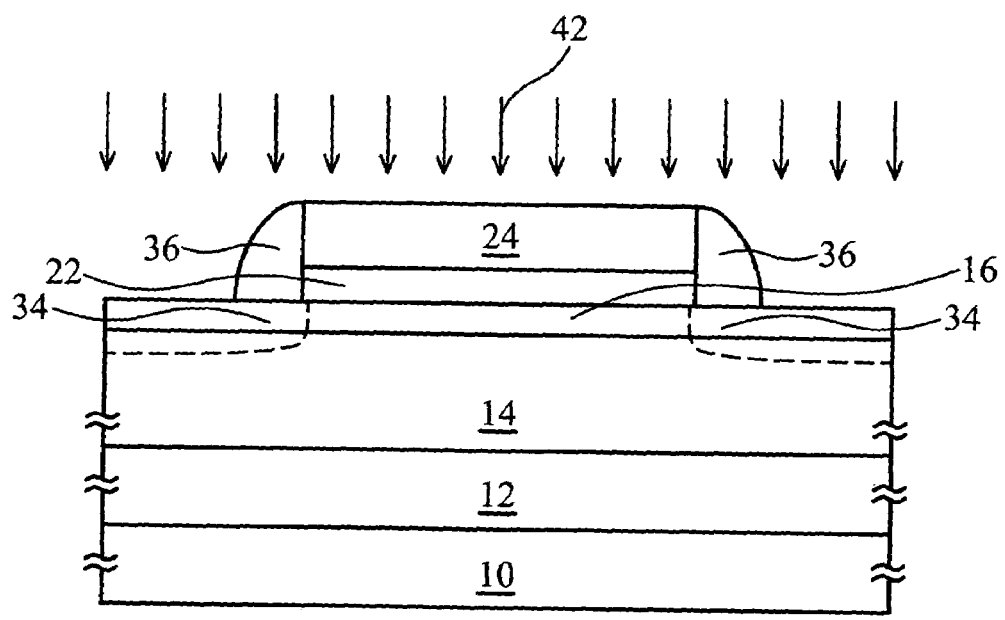
Figure 2D:
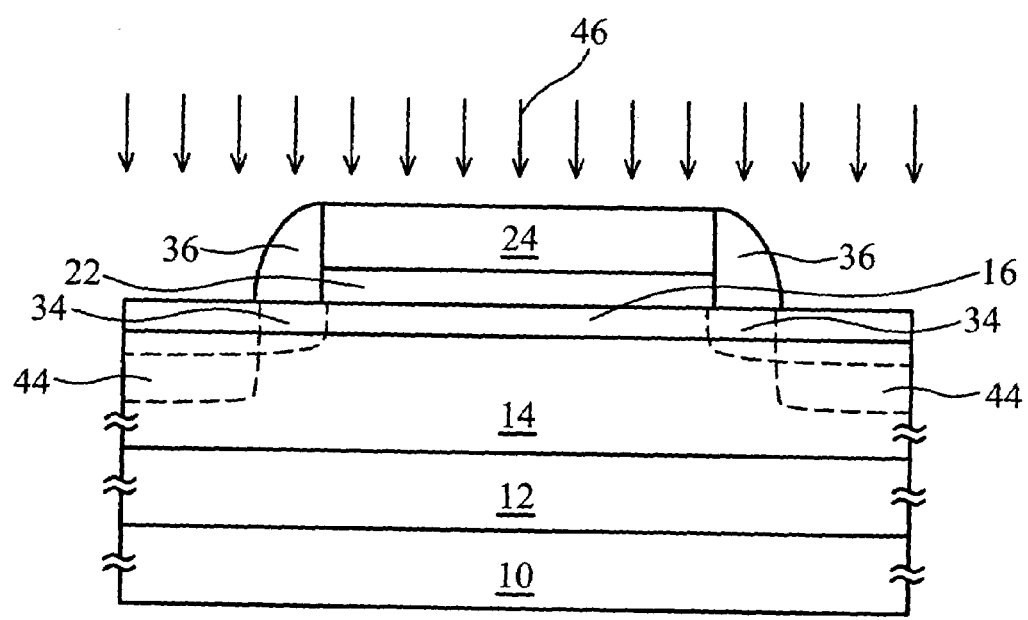

According to the present invention, in FIG. 1, a strained silicon carbon alloy MOSFET structure comprises a substrate 10, such as a silicon substrate, a graded SiGe layer 12, a relaxed buffer layer 14, such as a relaxed SiGe buffer layer, a strained silicon carbon alloy layer 16, a gate dielectric layer 22, a ploysilicon gate electrode 24, a sidewall spacer 36, a source/drain extension region 34, and a source/drain region 44.

In FIG. 1, with a difference between Si and C in lattice constant of about 52%, the strained silicon carbon alloy layer has higher effective strains compared to the conventional strained silicon layer, significantly increasing carrier mobility, improving the asymmetry of the carrier mobility for PMOS and NMOS.

The fabrication steps of a strained silicon carbon alloy MOSFET structure are shown in FIG. 2. In FIG. 2(a), an epitaxy graded SiGe layer 12 is formed on the substrate 10, with a thickness of about 1 µm, Ge concentration from 0 to 20% (or higher, dependent on the designed strain of the strained silicon carbon alloy layer), next, an epitaxy relaxed buffer layer 14, is formed on the graded SiGe layer 12, with a thickness of about 1 µm, a Ge concentration from 0 to 20% (or higher, dependent on the designed strain of the strained silicon carbon alloy layer), must fully relaxed to achieve maximum efficiency of the strained silicon carbon alloy MOSFET. Subsequently, an epitaxy strained silicon carbon alloy layer 16 is formed on the relaxed buffer layer 14, a gate dielectric layer 22 (can be low temperature oxide; LTO), such as $HfO_2$, $Si_3N_4$, $Al_2O_3$, or any high dielectric constant (high k) dielectric material, is then formed on the strained silicon carbon alloy layer 16, at less than 800° C., and then, a polysilicon gate electrode 24 is formed on the gate dielectric layer 22, with diffusion or ion implantation, at temperature less than 800° C., and the gate dielectric layer 22 and the polysilicon gate electrode 24 are patterned using lithography, etching or other methods. In FIG. 2(b), a source/drain extension region 34 is formed using ion implantation 32. In FIG. 2(c), a spacer 36 is formed using lithography/etching or other methods, and, using the sidewall spacer as a mask layer, the source/drain region 44 is formed by ion implantation 42. In FIG. 2(d), the device is finally annealed 46 using furnace or rapid thermal annealing (RTA), at temperature less than 800° C.

Figure 3:
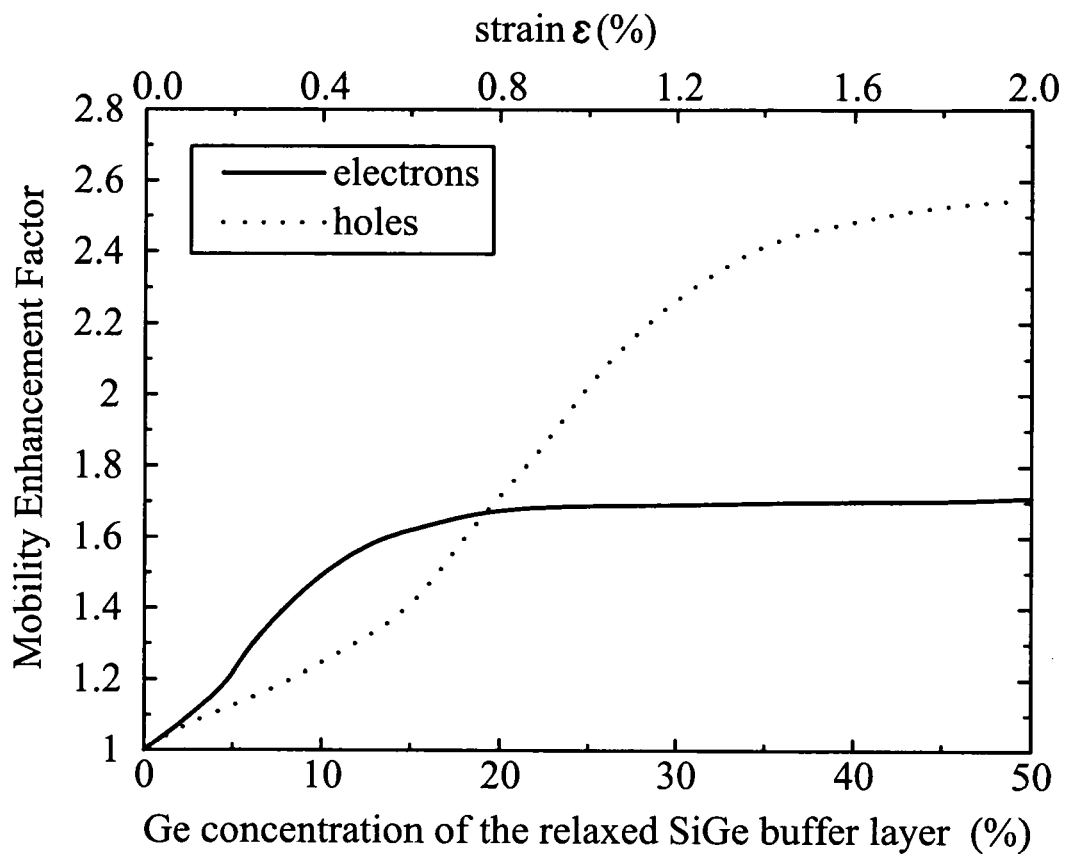
FIG. 3 shows the relationship between the Ge concentration (%) of the relaxed buffer layer and the electron/hole mobility enhancement factor. The upper axis is the equivalent strain at corresponding Ge concentration.

FIG. 3 shows the relationship between electron/hole mobility enhancement factor and Ge concentration (%) in a relaxed buffer layer of the conventional strained silicon MOSFET, wherein the electron mobility enhancement factor is saturated when the Ge concentration reaches 20%, but the hole mobility enhancement factor is saturated at 40%, when fixing the Ge concentration of relaxed buffer layer, for example, less than 20%, the mobility enhancement factor of the electron is higher than the hole, resulting in driving current asymmetry between NMOS and PMOS, creating difficulties in circuit design. Using the difference between Si & C in lattice constant of about 52%, theoretically, the efficiency of 1% addition carbon content equals 10% of Ge doping in relaxed buffer layer 14, enhancing the strain and improving the driving current asymmetry between NMOS and PMOS.

Figure 4:
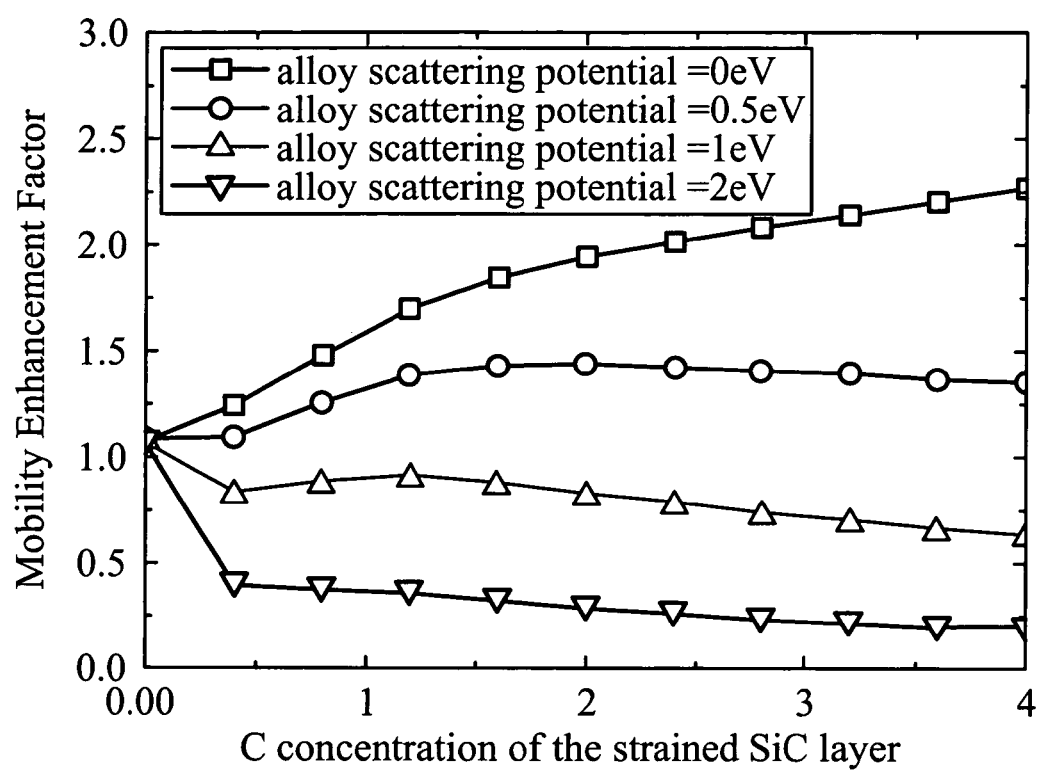
FIG. 4 shows, with varied alloy scattering potential, the relationship between the carbon concentration from 0 to 4% of the strained silicon carbon alloy layer on Si substrate and the electron mobility enhancement factor according to the present invention.

FIG. 4, with varied alloy scattering potential, shows the relationship between the carbon concentration (%) of the strained silicon carbon alloy and the electron mobility enhancement factor, wherein the alloy scattering potential is higher in silicon carbon alloy than SiGe. When the calculation range of the alloy scattering potential is extended from 0 to 2 eV, at a lower potential level, electron mobility enhancement factor is significant, and with lower alloy scattering potential level (<0.6 eV), the strained effect is meaningful, however the high alloy scattering potential level (>1 eV) decreasing the electron mobility enhancement factor, showing no effect on electron mobility enhancement factor if increasing only the carbon concentration, even lower than the original electron mobility enhancement factor of the relaxed silicon.

Figure 5:
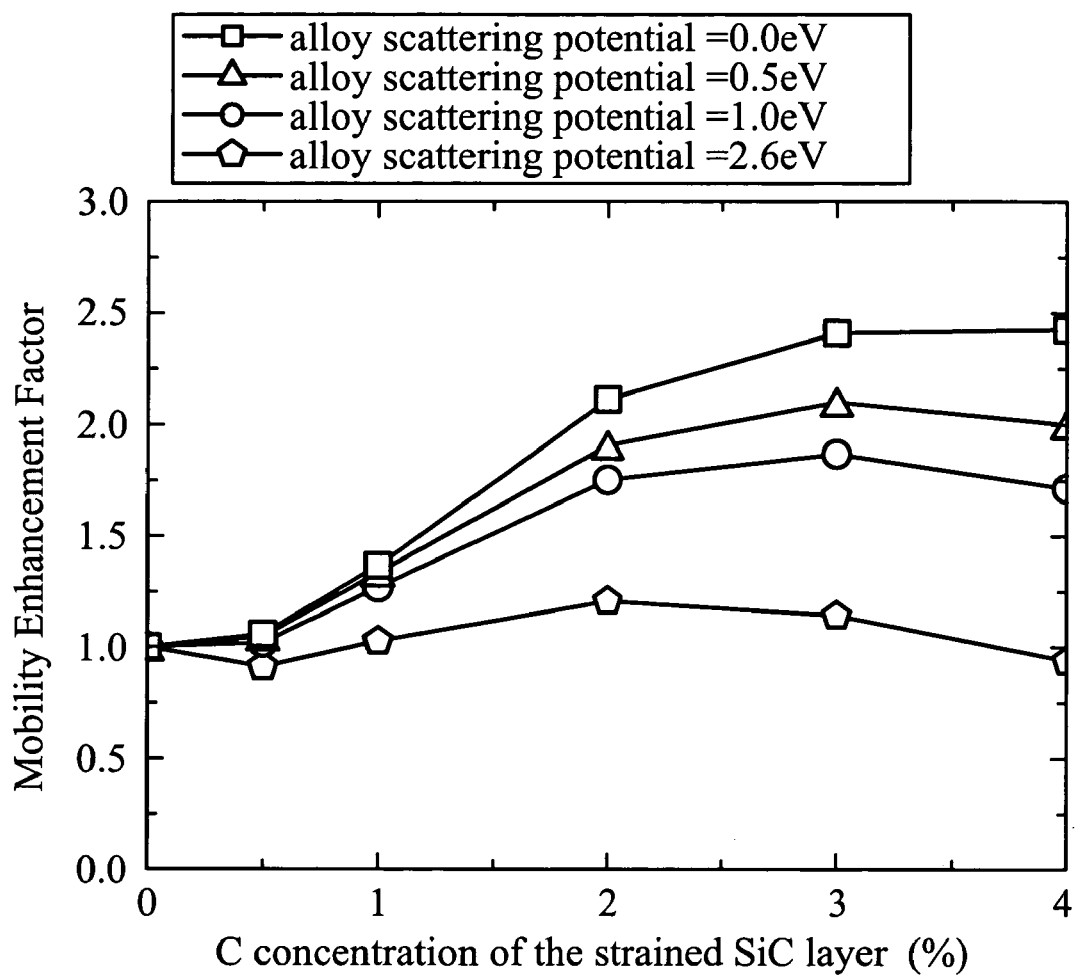
FIG. 5 shows, with varied alloy scattering potential, the relationship between the carbon concentration from 0 to 7% of the strained silicon carbon alloy layer on Si substrate and the hole mobility enhancement factor.

FIG. 5, with varied alloy scattering potential, shows the relationship between the carbon concentration of the strained silicon carbon alloy and the hole mobility enhancement factor, in which the hole mobility enhancement factor versus the carbon concentration of the strained silicon carbon alloy layer depends on the alloy scattering potential value, and in the strained silicon carbon alloy layer, the hole energy band is split due to strain, resulting in most of the holes being distributed at the light hole band with the smaller effective mass, and, in addition, whereby the split hole energy band decreases scattering of the valley between bands, increasing hole mobility enhancement factor in a planar direction. When alloy scattering potential is at the 0 eV level, the holes mobility can reach 1200 $cm^2$/Vs, however, with increased carbon concentration in the strained silicon carbon alloy layer, the alloy scattering potential increases, conversely, decreasing the hole mobility enhancement factor. At a low carbon concentration level, the effect of the alloy scattering is minor, since the inter-valley scattering is greatly decreased due to strain, and the hole mobility is increased with the increased carbon concentration. At a high carbon concentration level, however alloy scattering potential dominates the hole mobility mechanism, overcoming the effects of the decreased inter-valley scattering arising from strained silicon carbon alloy decreasing the hole mobility enhancement factor.

Figure 6:
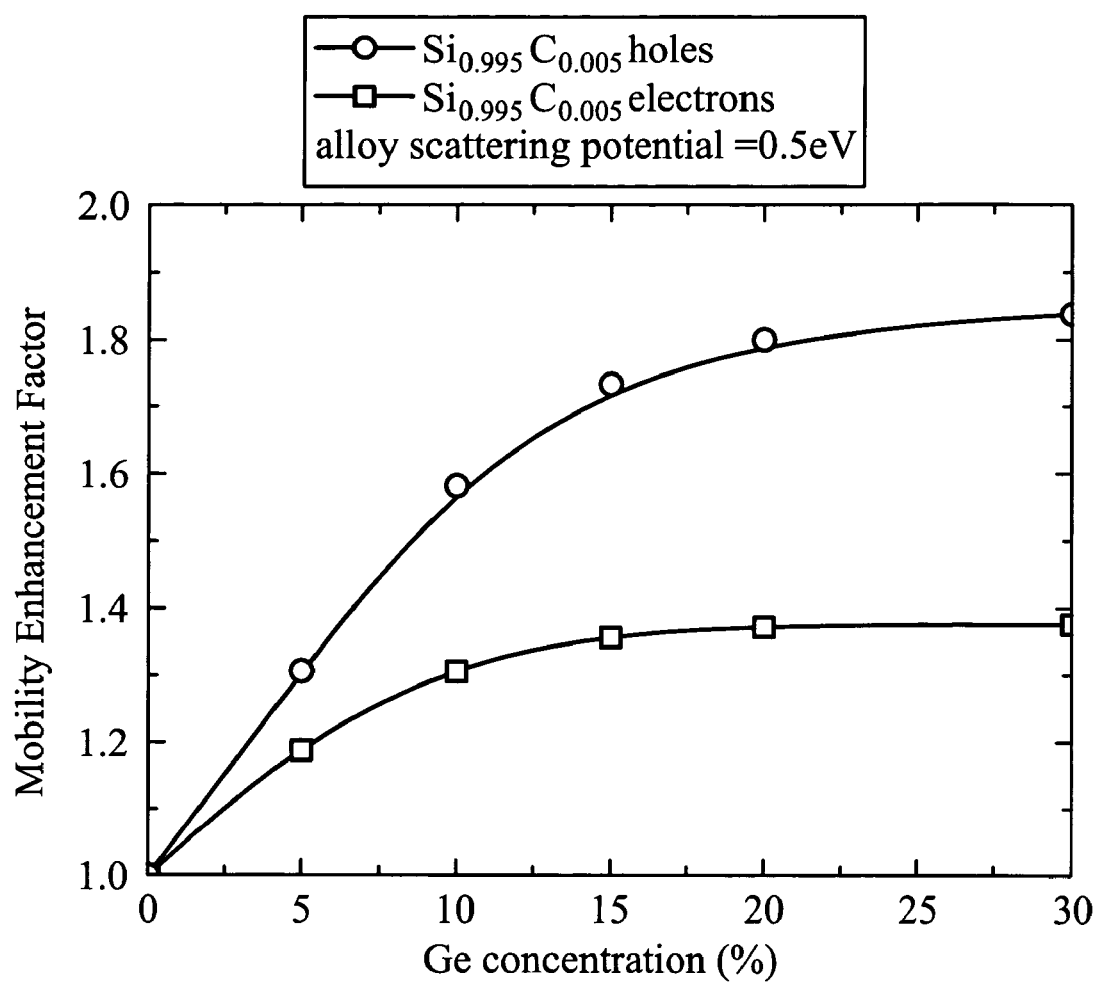
FIG. 6 shows, at 0.5% of the carbon concentration for FIGS. 4 & 5, the relationship between the Ge concentration (%) of the substrate and the electron/hole mobility enhancement factor.

FIG. 6, at a 0.5% of the carbon concentration shown in FIGS. 4 & 5, when altering the substrate from silicon to relaxed SiGe, the mobility enhancement factor of the hole is much higher than the electrons, improving the symmetry of the electron/hole mobility enhancement factor by adjusting the Ge concentration to achieve a PMOS and NMOS with improved current driving force and symmetry speed.

Conclusively, with the benefit of strain in silicon carbon alloy being more significant than in silicon, the MOSFET structure according to the invention uses silicon carbon alloy instead, providing better symmetry of the designed current driving force and speed, minimizing the device scale and enhancing the current driving force.

Although the present invention has been particularly shown and described above with reference to the preferred embodiment, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A strained silicon carbon alloy MOSFET structure, comprising:
   a substrate;
   a graded SiGe layer on the substrate;
   a relaxed buffer layer on the graded SiGe layer;
   a strained silicon carbon alloy layer on the relaxed buffer layer acting as a channel;
   a gate dielectric layer in contact with the strained silicon carbon alloy layer;
   a gate electrode on the gate dielectric layer; and
   a source and drain region on the substrate opposite and adjacent to the gate electrode.

2. The structure of claim 1, wherein the relaxed buffer layer comprises Si—Ge—C alloy, Si, Ge or other combinations of at least two semiconductor materials.

3. The structure of claim 1, wherein the gate dielectric layer comprises $HfO_2$, $Si_3N_4$, $Al_2O_3$, or any high dielectric constant (high k) dielectric material.

4. The structure of claim 1, wherein the MOSFET is a NMOS or PMOS.

5. The structure of claim 1, wherein the gate electrode is polysilicon gate electrode.

6. The structure of claim 1, wherein the substrate comprises n-type and p-type doped Ge, III–V group semiconductor, or silicon-on-insulator (SOI).

* * * * *